United States Patent [19]

Maggio et al.

[11] Patent Number: 5,498,840
[45] Date of Patent: Mar. 12, 1996

[54] TRANSDUCER SIGNAL TERMINATOR

[75] Inventors: Mark S. Maggio, Bethany; David S. Allsup, Oklahoma City; Alvin E. Cox, Yukon; Tom Metzner; Steven Eckerd, both of Oklahoma City; Loren Skarky, Bethany, all of Okla.

[73] Assignee: Seagate Technology, Inc., Scotts Valley, Calif.

[21] Appl. No.: 230,395

[22] Filed: Apr. 20, 1994

[51] Int. Cl.$^6$ ..................................................... H05K 1/18
[52] U.S. Cl. ........................ 174/260; 174/261; 174/262; 174/265; 361/760; 361/770; 361/785; 361/790
[58] Field of Search ................................. 174/260, 250, 174/261, 262, 263, 264, 265, 266, 267; 361/760, 770, 784, 785, 790

[56] References Cited

U.S. PATENT DOCUMENTS 5,219,639  6/1993  Sugawara et al. .

Primary Examiner—Laura Thomas
Attorney, Agent, or Firm—Kinney & Lange

[57] ABSTRACT

A transducer signal terminator for providing electrical connections between a plurality of read/write transducer lead wires and a preamplifier includes a substrate having a plurality of layers and has a plurality of intermediate strips attached to the substrate. A plurality of head pads are located on the substrate to provide interconnection points between the lead wires and the substrate. Each intermediate strip is placed on the substrate such that each of a plurality of holes therein is aligned with one of the head pads on the substrate. An electrical connection is then formed between each head pad and a corresponding conductive pad of the intermediate strip.

24 Claims, 4 Drawing Sheets

TRANSDUCER SIGNAL TERMINATOR

BACKGROUND OF THE INVENTION

The present invention concerns the electrical connection of the lead wires of a read/write transducer to a preamplifier circuit formed on a substrate and, more particularly, the maximization of the number of electrical connections that can be made on the substrate.

Typically in magnetic disc drives, signals from a read/write transducer are sent to a preamplifier circuit. The preamplifier circuit is generally formed on an electrically insulating substrate, and the resulting assembly is placed as close to the read/write transducer as possible. In many disc drives, it is desired to have the preamplifier assembly located on a rotary arm used to selectively position the transducer over the desired information storage track on the magnetic media on the disc. Such an arm must be capable of responding to positional change commands quickly, and so its inertia is minimized by keeping its mass, and therefore size, as small as possible. Thus, the preamplifier assembly will take up a large amount of the available space on the arm, creating a desire to minimize the size of the substrate.

The electrical connections between the read/write transducer lead wires and the preamplifier circuit are generally made by attaching the lead wires to spaced apart interconnection points on the substrate, with the result that the connections are horizontally spaced in a single plane. In so attaching the lead wires, a minimum distance must be maintained between the positions of adjacent interconnection points to prevent shorting.

A problem that has consequently arisen is that the area remaining available on the substrate for making the interconnection points for electrically connecting the transducer lead wires beyond that needed for the preamplifier circuit is continually decreasing. This is due in part to the use of smaller disc drives with correspondingly smaller rotary arms which have less room for the substrate thereon. Further, the use of increasing numbers of magnetic storage discs in a single disc drive requires a greater number of transducers to be used and therefore increases the number of electrical connections that must be made on the substrate.

In addition to the above pressures, the increasing use of magneto resistive (MR) transducers, many of which use twice the number of lead wires as conventional magnetic transducers, requires that still further electrical connections be made on the substrate.

SUMMARY OF THE INVENTION

The present invention provides a transducer signal terminator for providing electrical connections between a plurality of read/write transducers and a preamplifier circuit. The signal terminator comprises a substrate having the preamplifier circuit formed thereon and further has a plurality of intermediate strips which are attached to the substrate.

The substrate has a first layer and a second layer, each of which has a plurality of head pad sets mounted thereon. Each head pad set comprises four head pads which are used to electrically connect lead wires from one of the transducers to the preamplifier circuit. The first layer of the substrate has a plurality of openings therein at one end, exposing portions of the second layer. The head pad sets are located on the exposed portions of the second layer and on those portions of the first layer between the openings so that adjacent head pad sets are vertically separated. The openings also provide guides for insertion of the intermediate strips, helping to orient the strips as well as hold them in place.

Each intermediate strip comprises a conductive first layer, which is divided into four conductive pads, and an insulating second layer. In addition, each intermediate strip has four holes therethrough. The lead wires from each transducer are attached to the conductive pads and each intermediate strip is then positioned on one of the head pad sets such that each of the holes in the intermediate strip is aligned with one of the head pads in the head pad set. Each conductive pad is heated such that the head pads melt and flow up through the holes in the intermediate strip to form an electrical path between each conductive pad and the corresponding head pad.

By providing vertical separation between adjacent head pad sets, the distance between the head pad sets necessary to prevent electrical shorting can be maintained while decreasing the horizontal spacing between sets. This allows a greater number of interconnection points to be placed on a substrate having a limited width. In addition, it helps to free the space necessary for the preamplifier circuit to be located on the rotary arm.

The intermediate strips also help prevent electrical shorting by providing insulation between adjacent head pad sets and by drawing solder from the head pads through the holes, thus preventing the solder from spilling onto adjacent head pads when the electrical connection is made.

DETAILED DESCRIPTION OF THE PREFERRED EMBODIMENTS

Figure 1:
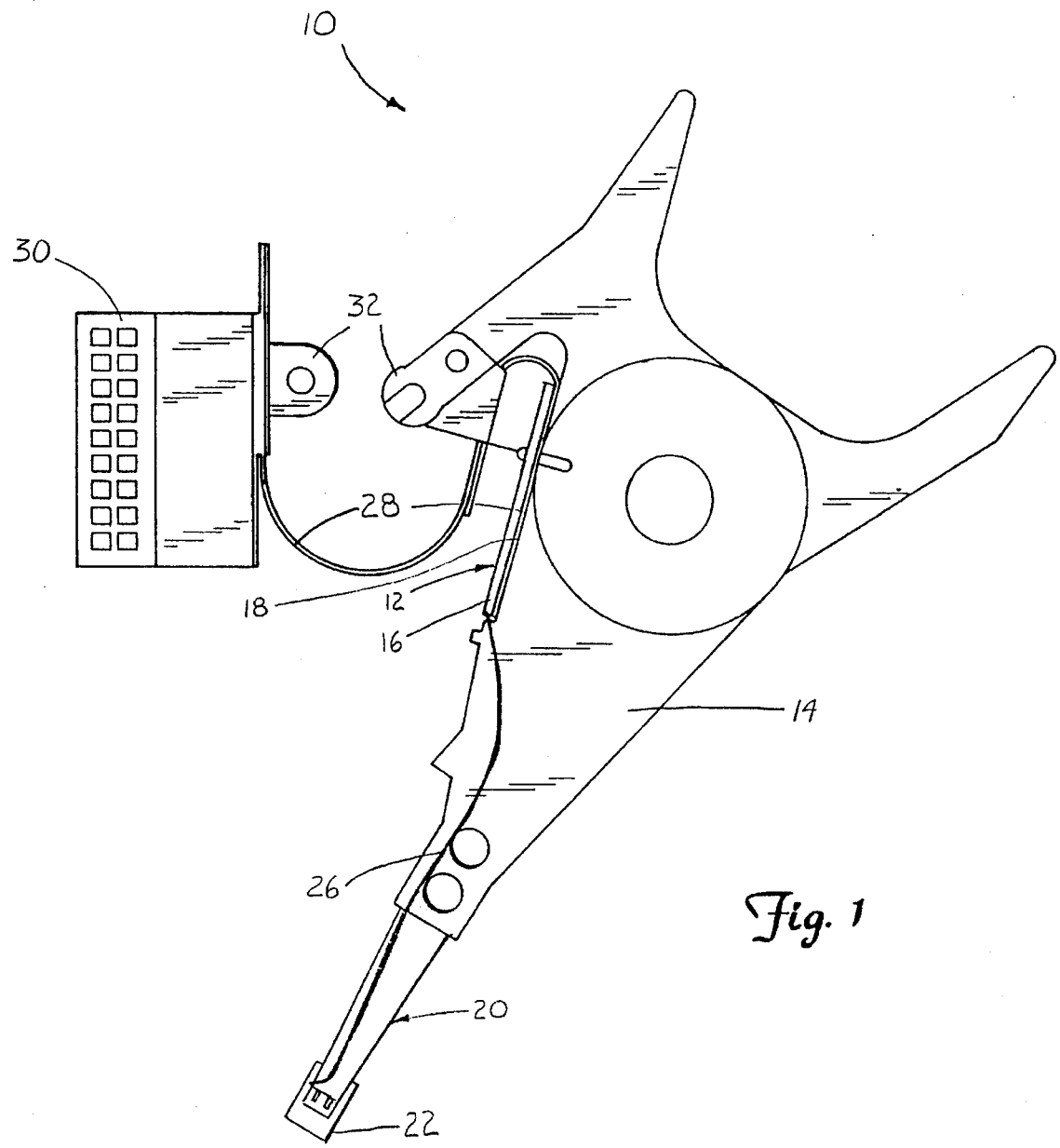
FIG. 1 is a schematic representation of a top view of a portion of a magnetic disc drive.

A portion of a disc drive 10 in which a transducer signal terminator 12 of the present invention is utilized is shown in FIG. 1. Disc drive 10 includes a rotary arm 14 and a co-fired ceramic substrate 16 attached to a first side 18 of rotary arm 14. A plurality of head spring assemblies 20, each including a read/write transducer 22, are attached to rotary arm 14. Four lead wires 26 extend from each transducer 22 to substrate 16. A flexible circuit 28 is attached to rotary arm 14 between substrate 16 and first side 18 and extends to a flex connector 30 which is spaced from rotary arm 14. Flexible circuit 28 is constrained in part by a pair of brackets 32 and provides a path for electrical signals between a preamplifier circuit located on substrate 16 and flex connector 30, which is electrically connected to signal processing circuitry (not shown).

Figure 2:
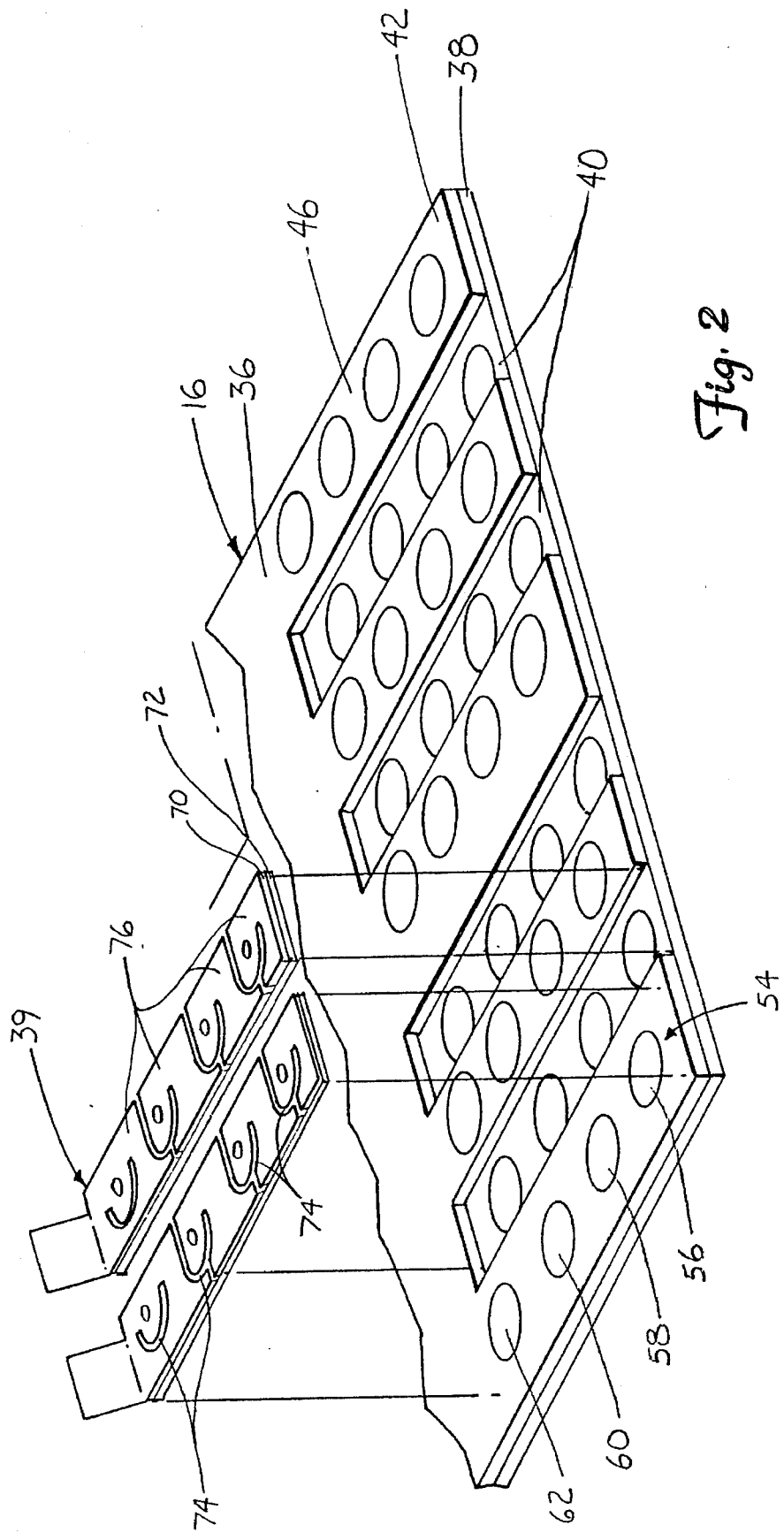
FIG. 2 is a perspective view of the transducer signal terminator of the present invention.

A portion of signal terminator 12 is shown in FIG. 2 and includes substrate 16, which has both a first layer 36 and a second layer 38, and further has nine intermediate circuit interconnection portions, or intermediate strips, 39. Both first layer 36 and second layer 38 of substrate 16 have an outer perimeter having the general shape of a rectangle. However, the shape of first layer 36 is modified to have a plurality of generally parallel rectangular openings 40 cut therein from a first end 42, forming slots and thereby leaving a plurality of generally parallel rectangular fingers 46 that extend to first end 42 on either side of each opening 40. Both first and second layers 36 and 38 have a thickness generally between 6 and 9 mils.

Figure 3:
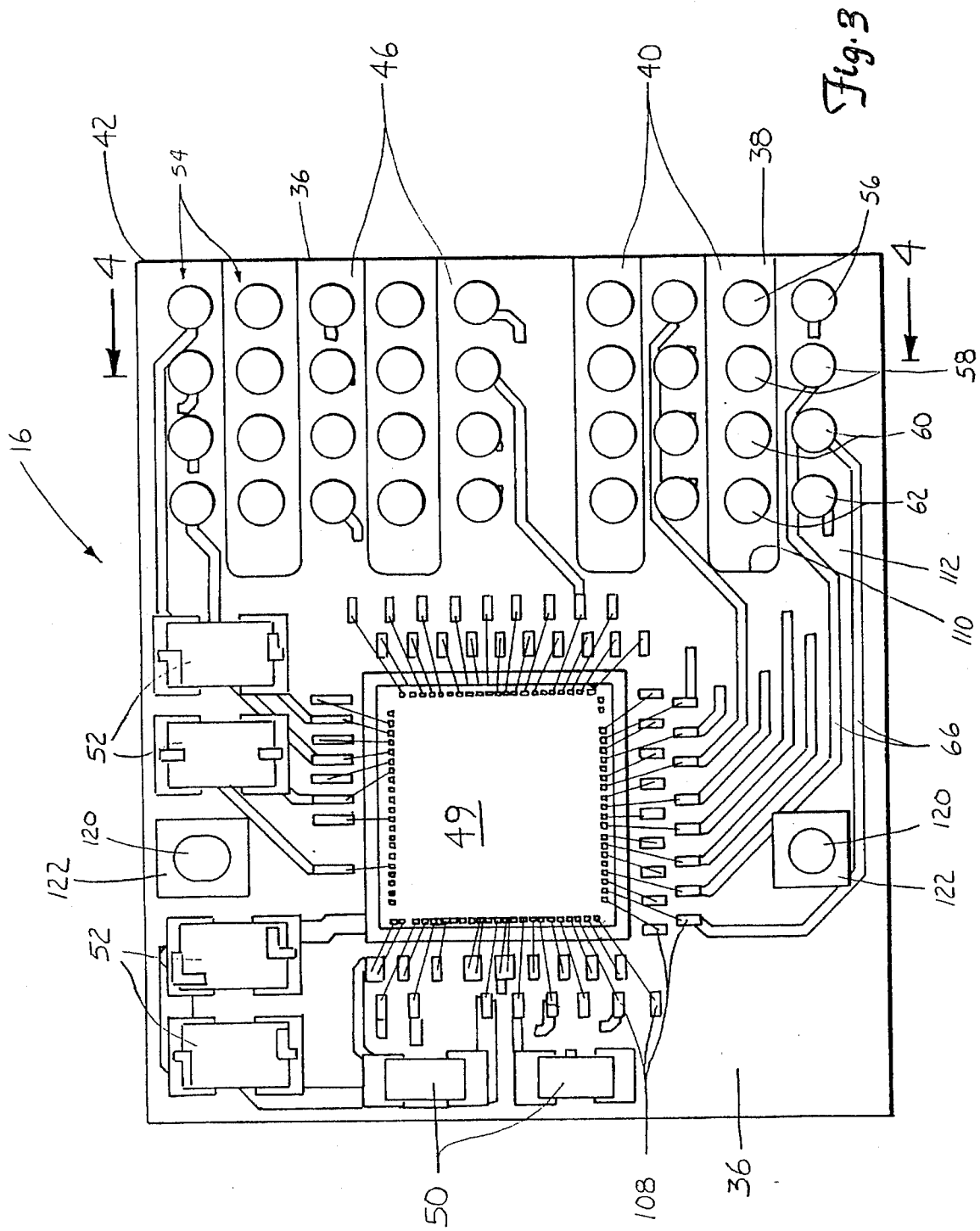
FIG. 3 is a schematic representation of a top view of a portion of the transducer signal terminator.

A preamplifier circuit comprising a monolithic integrated circuit die 49, a pair of surface mount resistors 50 and four surface mount capacitors 52, is located on first layer 36 of substrate 16 away from fingers 46 and is shown in FIG. 3. A plurality of head pad sets 54 are located on both first layer 36 and second layer 38 of substrate 16 and each includes a first head pad 56, a second head pad 58, a third head pad 60 and a fourth head pad 62. Head pads 56,58,60,62 preferably comprise solder and are electrically connected to the preamplifier circuit via a plurality of electrically conductive interconnection runs 66, some of which extend between first and second layers 36 and 38 of substrate 16. The preamplifier circuit, which has a main preamplifier including a multiplexer, is also electrically connected to flexible circuit 28 by runs 66. Because each head pad set 54 includes four head pads 56,58,60,62, each set 54 provides an electrical connection to the preamplifier circuit for one of transducers 22. Therefore, it is necessary to provide a head pad set 54 on substrate 16 for each transducer 22 that is used in disc drive 10.

Figure 4:
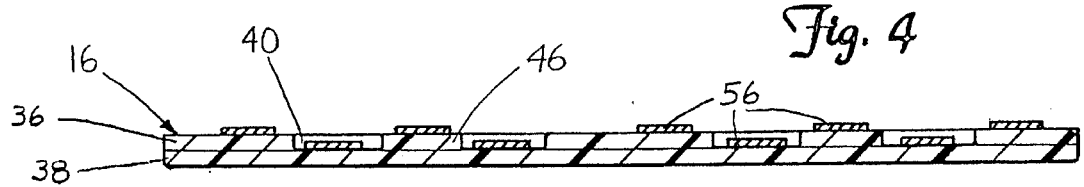
FIG. 4 is a sectional view of a portion of the transducer signal terminator taken along the line 4—4 of FIG. 3.

Second layer 38 of substrate 16 has four head pad sets 54 thereon which are positioned such that each set 54 is aligned with one of openings 40 in first layer 36. First layer 36 has five head pad sets 54 thereon, each of which is positioned on one of fingers 46. The placement of head pads 56,58,60,62 on both first layer 36 and second layer 38 of substrate 16 provides a vertical separation of about 8 mils between adjacent head pad sets 54 as can be seen in FIG. 4. This allows the horizontal distance between adjacent head pad sets 54 to be decreased without causing shorting between adjacent sets 54. This in turn allows a greater number of head pad sets 54 to be placed on substrate 16.

Figure 5:
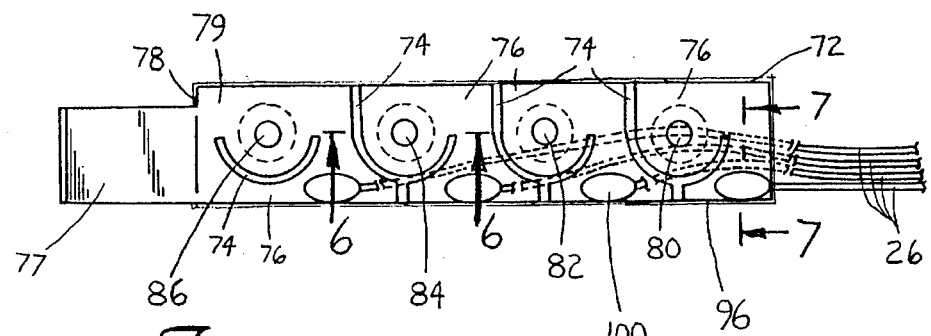
FIG. 5 is a schematic representation of a top view of a portion of the transducer signal terminator.
Figure 6:
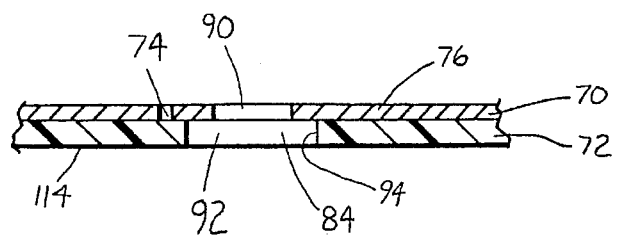
FIG. 6 is a sectional view of a portion of the transducer signal terminator taken along the line 6—6 of FIG. 5.

An intermediate strip 39 used in signal terminator 12 is shown in more detail in FIGS. 5 and 6. Intermediate strip 39 has both a first layer 70 which is generally fabricated from an electrical conductor such as copper and a second layer 72 which is generally fabricated from an electrically insulating material such as Kapton™. Four grooves 74 are cut into first layer 70, exposing second layer 72 and effectively separating first layer 70 into four separate copper pads 76. First layer 70 of each intermediate strip 39 is approximately 1.5 mils thick while second layer 72 is approximately 3.0 mils thick. First and second layers 70 and 72 are held together by an adhesive.

A copper tab 77 extends from a first edge 78 of intermediate strip 39 at approximately a 45 degree angle to a top surface 79 of first layer 70. Tab 77 is designed to aid in the manual manipulation of intermediate strip 39. Except for first edge 78, each edge of first layer 70 is set back from the corresponding edge of second layer 72 by approximately 2 mils.

A first cavity 80, a second cavity 82, a third cavity 84 and a fourth cavity 86 extend through intermediate strip 39. Each of cavities 80,82,84,86 comprises a generally cylindrical first hole 90 in first layer 70 and a generally cylindrical second hole 92 in second layer 72. Each first hole 90 is centered about the same axis as the corresponding second hole 92 and has a diameter of approximately 10 mils. Second hole 92 has a diameter of approximately 22 mils and has an inner surface 94 which is plated with solder. First holes 90, as well as grooves 74, are formed by etching while second holes 92 are formed through the use of a mechanical punch or a laser.

Figure 7:
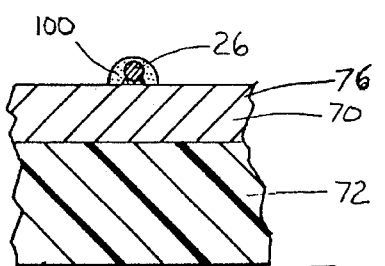
FIG. 7 is a sectional view of a portion of the transducer signal terminator taken along the line 7—7 of FIG. 5.

Lead wires 26 from transducer 22 are electrically connected to intermediate strip 39 as shown in FIG. 5. Each lead wire 26 is electrically connected to one of copper pads 76 on the top side thereof, such as through sonic welding, at a position between one of grooves 74 and a first side 96 of intermediate strip 39. Lead wires 26 are shown in dashed line form over a portion of intermediate strip 39 to avoid obscuring the view of intermediate strip 39. A thin layer of an encapsulant 100 is placed over the sonic weld between each lead wire 26 and corresponding copper pad 76 as shown in FIGS. 5 and 7. Encapsulant 100, which can be an adhesive such as a UV curable epoxy, helps to absorb the physical stresses that may be placed on lead wires 26, thereby helping to preserve the sonic weld between each lead wire 26 and copper pad 76. Grooves 74 act as a barrier to prevent encapsulant 100 from flowing into cavities 80,82, 84,86. Intermediate strip 39 thus retains the orientation of lead wires 26.

An intermediate strip 39 is positioned on each head pad set 54 on second layer 38 such that first end 78 of each intermediate strip 39 faces an inner end 110 of each opening 40 as shown in FIG. 2. An intermediate strip 39 is also positioned on each head pad set 54 on first layer 36 such that first end 78 of each intermediate strip 39 is positioned over an inner end 112 of each finger 46. When intermediate strips 39 are so positioned, each one of first, second, third and fourth cavities 80,82,84,86 is aligned with a corresponding one of first, second, third and fourth head pads 56,58,60,62, respectively, and a bottom side 114 of second layer 72 contacts substrate 16.

Intermediate strips 39 are attached to substrate 16 by heating each copper pad 76. The application of heat melts the solder plated on inner surface 94 of each corresponding second hole 92, as well as the solder of the corresponding one of head pads 56,58,60,62. The solder is drawn up through each of cavities 80,82,84,86 to form an electrical connection between each copper pad 76 and corresponding one of head pads 56,58,60,62. The melting of the solder also forms a bond holding intermediate strip 39 in place on substrate 16. By drawing the solder from the head pads up through each of cavities 80,82,84,86, the solder is prevented from flowing between intermediate strip 39 and substrate 16 when melted. This helps to prevent shorts between adjacent head pad sets 54. The dimensions of the cavities will greatly affect the amount of solder that is drawn therethrough. The borders created by openings 40 help to orient and hold intermediate strips 39 in place during the attachment process. These borders also partially retain intermediate strips 39 in openings 40 after the attachment process.

An encapsulant is placed on first layer 36 of substrate 16 to cover die 49 and a plurality of die bonds 108, shown in FIG. 3. The encapsulant preferably comprises HYSOL 4401 but can also comprise a variety of other materials. Substrate 16 is held in place on rotary arm 14 through the use of two pins 120 which are attached to rotary arm 14 and extend through substrate 16 and through openings in connection pads 122. Pins 120 are then soldered in place, holding substrate 16 on first side 18 of rotary arm 14.

By providing vertical separation between adjacent head pad sets 54, the distance between head pad sets 54 is increased over the previous practice of having interconnection points horizontally spaced in a single plane, helping to prevent electrical shorts between adjacent head pad sets 54. Intermediate strips 39 also help to prevent electrical shorts between adjacent head pad sets 54 through the use of non-conductive second layer 72. In addition, intermediate strips 39 help to prevent electrical shorts between adjacent head pad sets 54 by drawing solder up from head pads 56,58,60,62 through cavities 80,82,84,86. Each of these factors permits a greater number of head pad sets 54 to be placed on substrate 16 and thus permits a greater number of electrical connections to be made between the preamplifier circuit and transducer lead wires 26.

The use of vertically separated substrate layers 36 and 38, along with the use of openings 40 also helps to align transducer lead wires 26 with respect to substrate 16. The use of intermediate strips 39 allows the electrical connections between transducers 22 and the preamplifier circuit to be made more easily. This is because lead wires 26 are first attached to each intermediate strip 39 which can then more easily be attached to substrate 16 than if lead wires 26 were directly connected to head pad sets 54.

The use of generally rectangular openings 40 in first layer 36 of substrate 16 has the additional benefit of providing a channel that constrains movement of intermediate strips 39 on three sides. This simplifies the retention of intermediate strips 39, which can then be permanently retained through the application of an adhesive at the open end of each opening 40.

Although described as having two layers on which head pads sets 54 were located, substrate 16 can have additional layers on which head pad sets 54 may be located. While nine head pad sets 54 were described as having four head pads 56,58,60,62 each, any number of head pad sets 54 can be placed on substrate 16 subject only to the physical limitations of substrate 16. Further, head pad sets 54 can have any number of head pads therein and can be arranged in any of a variety of configurations.

While substrate 16 was described as having a first layer 36 and a second layer 38 only, substrate 16 can have a plurality of additional layers as well. These layers can be used not only to provide further vertical spacing between head pad sets 54, but can be used to provide more runs 66 between head pads 56,58,60,62 and the preamplifier circuit. Further, openings 40 can have any desired shape and need not be located at the edge of substrate 16.

Each intermediate strip 39 can be designed so that there are no cavities therein. In this case, the connection of lead wires 26 to intermediate strip 39 and the connection of intermediate strip 39 to head pads 56,58,60,62 is accomplished at the top side of intermediate strip 39. The connection of intermediate strip 39 to head pads 56,58,60,62 is accomplished by wire bonding.

Although the present invention has been described with reference to preferred embodiments, workers skilled in the art will recognize that changes may be made in form and detail without departing from the spirit and scope of the invention.

What is claimed is:

1. A transducer signal terminator for electrically connecting to an element located on a substrate a plurality of lead wires extending from a device located elsewhere than on the substrate, said transducer signal terminator comprising:

a substrate having a plurality of layers, wherein said substrate includes a first layer having an outer surface and a second layer having a surface closest to said first layer, said first layer having a plurality of openings therein, each of which exposes a portion of said closest surface of said second layer, said substrate having said element provided thereon; and a plurality of interconnection points located on both said outer surface of said first layer and the exposed portions of said closest surface of said second layer, wherein each of said lead wires can be electrically connected to one of said interconnection points, and wherein said interconnection points are electrically connected to said element.

2. The transducer signal terminator of claim 1 wherein said interconnection points comprise electrically conductive head pads which are deposited on the substrate.

3. The transducer signal terminator of claim 2 wherein said openings in said first layer comprise generally rectangular slots extending inwardly from a first end of said first layer and wherein said slots define a plurality of generally rectangular finger portions of said first layer.

4. The transducer signal terminator of claim 3 wherein four of said head pads are located on each of said finger portions of said first layer and wherein four of said head pads are located on each of the exposed portions of said closest surface of said second layer.

5. The transducer signal terminator of claim 1 and intermediate means positioned between said lead wires and said interconnection points for electrically connecting said lead wires to said interconnection points.

6. The transducer signal terminator of claim 5 wherein said intermediate means comprises an electrically insulating layer having a first surface with a plurality of electrically conductive pads located thereon and wherein a plurality of holes extend through said intermediate means to provide a path between said conductive pads and said interconnection points.

7. The transducer signal terminator of claim 6 wherein said intermediate means is positioned on said substrate such that a second surface of said insulating layer contacts said substrate and each of said holes is aligned with one of said interconnection points.

8. The transducer signal terminator of claim 7 wherein said transducer signal terminator includes a plurality of said intermediate means.

9. A transducer signal terminator for electrically connecting to an element located on a substrate a plurality of lead wires extending from a device located elsewhere than on the substrate, said transducer signal terminator comprising:

a substrate having at least a first layer having an outer surface, said substrate having said element assembled thereon;

a plurality of interconnection points located on said outer surface of said first layer, wherein said interconnection points are electrically connected to said element; and intermediate means positioned between said interconnection points and said lead wires such that said intermediate means covers said interconnection points, for electrically connecting said lead wires to said interconnection points.

10. The transducer signal terminator of claim 9 wherein said intermediate means comprises an electrically insulating layer having a first surface with a plurality of electrically conductive pads located thereon and wherein a plurality of holes extend through said intermediate means to provide a path between said conductive pads and said interconnection points.

11. The transducer signal terminator of claim 10 wherein said intermediate means is positioned on said outer surface of said first layer such that a second surface of said insulating layer contacts said outer surface of said first layer and each of said holes is aligned with one of said interconnection points.

12. The transducer signal terminator of claim 11 wherein said interconnection points comprise electrically conductive head pads.

13. The transducer signal terminator of claim 12 wherein said substrate has a plurality of layers, wherein said substrate includes said first layer and a second layer having a surface closest to said first layer, said first layer having a plurality of openings therein, each of which exposes a portion of said closest surface of said second layer.

14. The transducer signal terminator of claim 13 wherein said head pads are located on both said outer surface of said first layer and the exposed portions of said closest surface of said second layer.

15. The transducer signal terminator of claim 14 wherein said openings in said first layer comprise generally rectangular slots extending inwardly from a first end of said first layer and wherein said slots define a plurality of generally rectangular finger portions of said first layer.

16. The transducer signal terminator of claim 15 wherein said transducer signal terminator includes a plurality of said intermediate means.

17. The transducer signal terminator of claim 16 wherein four of said head pads are located on each of said finger portions of said first layer and wherein four of said head pads are located on each of the exposed portions of said closest surface of said second layer, and wherein each of said intermediate means has four conductive pads thereon.

18. A transducer signal terminator for electrically connecting to an element located on a substrate a plurality of lead wires extending from a device located elsewhere than on the substrate, said transducer signal terminator comprising:

a substrate having a first layer having an outer surface and a second layer having a surface closest to said first layer, said substrate having said element assembled thereon;

a plurality of electrically conductive head pads located on said outer surface of said first layer and said closest surface of said second layer of said substrate, wherein said head pads are electrically connected to said element; and a plurality of intermediate means positioned between said head pads and said lead wires for electrically connecting said lead wires to said head pads.

19. The transducer signal terminator of claim 18 wherein each of said intermediate means comprises an electrically insulating layer having a first surface with a plurality of electrically conductive pads located thereon and wherein a plurality of holes extend through said intermediate means to provide a path between said conductive pads and said head pads.

20. The transducer signal terminator of claim 18 wherein said first layer of said substrate has a plurality of openings therein exposing portions of said closest surface of said second layer, and wherein said head pads are located on the exposed portions of said closest surface of said second layer.

21. A transducer signal terminator for electrically connecting to an element located on a substrate a plurality of lead wires extending from a device located elsewhere than on the substrate, said transducer signal terminator comprising:

a substrate having a plurality of layers and having said element assembled thereon, wherein at least a first one of said layers has an opening therein, exposing a portion of a surface closest to said first one of said layers of at least one other of said layers;

a plurality of interconnection points located on said closest surface, wherein said interconnection points are electrically connected to said element; and intermediate means positioned between said interconnection points and said lead wires for electrically connecting said lead wires to said interconnection points.

22. The transducer signal terminator of claim 21 wherein said substrate has a first layer and a second layer having a surface closest to said first layer and wherein said first layer has a generally rectangular opening therein, exposing a portion of said closest surface of said second layer.

23. The transducer signal terminator of claim 22 wherein said intermediate means has a generally rectangular shape such that it can fit in said opening in said first layer.

24. The transducer signal terminator of claim 23 wherein said opening extends inwardly from a first end of said first layer.

\* \* \* \* \*